United States Patent
Nagatomo

[11] Patent Number: 5,973,347
[45] Date of Patent: *Oct. 26, 1999

[54] SEMICONDUCTOR MEMORY CELL HAVING STORAGE ELECTRODES WITH INCLINED PORTIONS

[75] Inventor: Yoshiki Nagatomo, Tokyo, Japan

[73] Assignee: Oki Electric Industry Co., Ltd., Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/610,752

[22] Filed: Mar. 4, 1996

[30] Foreign Application Priority Data

Apr. 17, 1995 [JP] Japan ..................................... 7-091154

[51] Int. Cl.$^6$ .................................................. H01L 27/108
[52] U.S. Cl. .......................................... 257/306; 257/309
[58] Field of Search ...................................... 257/306, 309

[56] References Cited

U.S. PATENT DOCUMENTS

| | | | |
|---|---|---|---|
| 5,140,389 | 8/1992 | Kimura et al. | 257/309 |
| 5,381,365 | 1/1995 | Ajika et al. | 257/306 |
| 5,459,685 | 10/1995 | Anzai et al. | 257/306 |
| 5,561,311 | 10/1996 | Hamamoto et al. | 257/309 |
| 5,629,540 | 5/1997 | Roh et al. | 257/309 |

FOREIGN PATENT DOCUMENTS 4-274360  9/1992  Japan.

*Primary Examiner*—Gene M. Munson
*Attorney, Agent, or Firm*—Rabin & Champagne, P.C.

[57] ABSTRACT

An object of the present invention is to provide a semiconductor memory cell capable of ensuring a large surface area of each of a plurality of storage electrodes thereby to increase the capacity of a capacitive portion (capacitor) formed between the storage electrode and a cell plate electrode, in other words, greatly increasing the capacity of the memory cell and to provide a method of manufacturing the semiconductor memory cell. The storage electrode is structured so as to have oblique inclinations. A semiconductor memory cell is normally selected by applying a voltage to a word line so as to start up the word line. Thus, the reading of information from or writing of it into the selected semiconductor memory cell is performed. The information is transferred to the corresponding memory cell from the outside of the memory cell through its corresponding bit line. Alternatively, the information is transferred to the outside. The retention of the information in the memory cell is carried out by electric charges stored in the capacitor formed between the storage electrode and the cell plate electrode. Therefore, the greater the capacity of the capacitor, the higher the performance of the memory cell is made.

10 Claims, 4 Drawing Sheets

SEMICONDUCTOR MEMORY CELL HAVING STORAGE ELECTRODES WITH INCLINED PORTIONS

BACKGROUND OF THE INVENTION

1. Field of the Invention

This invention relates to a semiconductor memory cell, and particularly to a one-transistor/one-capacity type DRAM (Dynamic Random Access Memory) cell for holding information therein by electric charges stored in a capacitor.

2. Description of the Related Art

With the development of mass storage capacity of a DRAM, the areas of cells, each of which constitutes a one-bit storage element, have been recently reduced every year. However, the achievement of stable operation of a circuit needs to ensure an electrostatic capacity exceeding some degree of capacity. Therefore, a stacked-capacitor cell or the like for forming a capacity between polysilicon layers formed in a few layers is used as a structure of a cell capacitor.

This has been disclosed in various literature (e.g., Japanese Patent Application Laid-Open No. 4-274360).

The present invention to be described later should be understood integrally with this literature. The present invention has been completed with a view toward providing a semiconductor memory cell capable of ensuring a large surface area of each of the storage electrodes thereby increasing the capacity of a capacitive portion (capacitor) formed between the storage electrode and a cell plate electrode, in other words, greatly increase the capacity of the memory cell as compared with those described in the literature.

SUMMARY OF THE INVENTION

Thus, in order to achieve the above object, the present invention provides a semiconductor memory cell comprising storage electrode formed over a semiconductor substrate; an insulative layer formed on the storage electrode; and a cell plate electrode formed on the insulative layer; wherein the storage electrode has planes inclined diagonally and upwardly to the direction of a principal surface of the semiconductor substrate.

Further, the present application is disclosing other various embodiments of the invention made to achieve the aforementioned object. These embodiments of the invention will be understood from the appended claims, the detailed description of the embodiments and the accompanying drawings.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIGS. 1(a) and 1(b) are cross-sectional views showing one embodiment of a semiconductor memory cell according to the present invention, wherein FIG. 1(a) is a cross-sectional view taken along line A—A of FIG. 2 and FIG. 1(b) is a cross-sectional view taken along line B—B of FIG. 2;

DETAILED DESCRIPTION OF THE PREFERRED EMBODIMENT

A structure of a semiconductor memory cell according to a preferred embodiment of the present invention will first be described below.

Figure 1A:
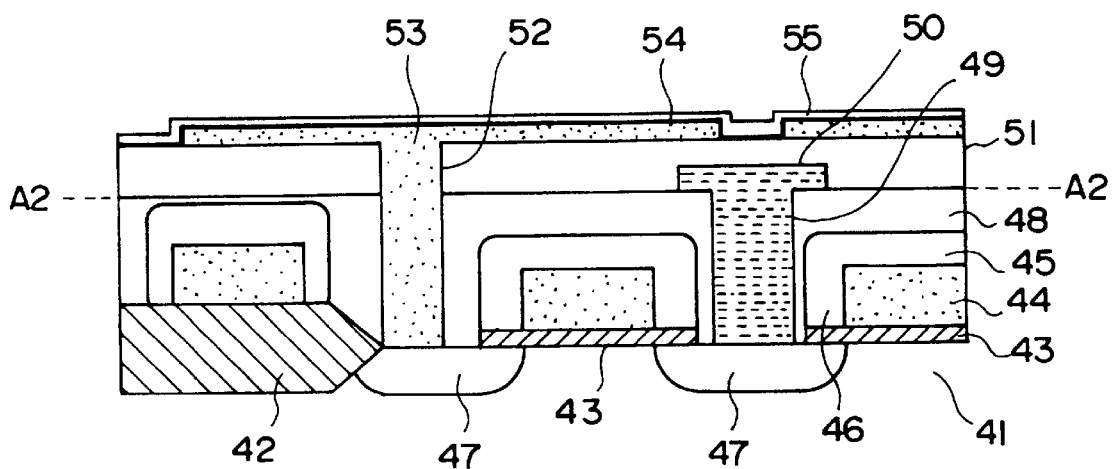
Figure 1B:
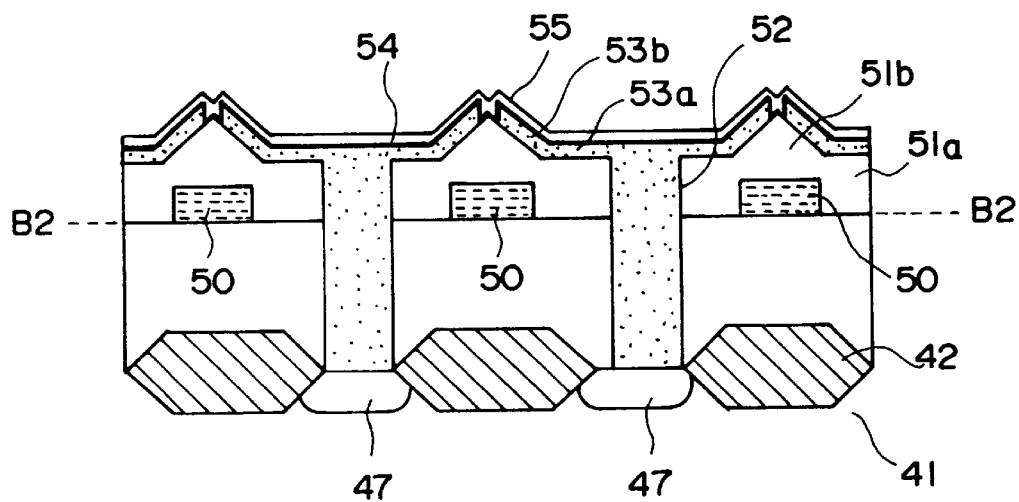
Figure 2:
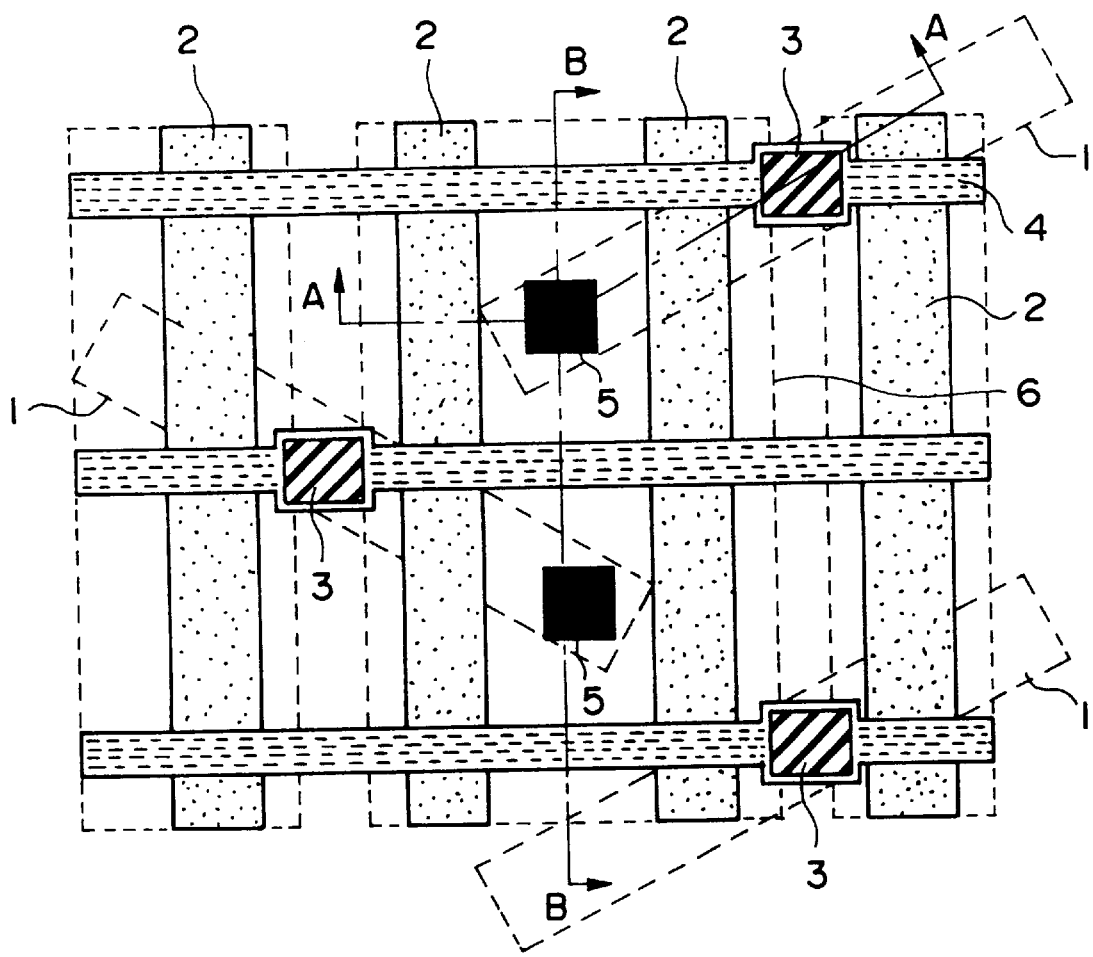
FIG. 2 is a plan view illustrating the semiconductor memory cell shown in FIGS. 1(a) and 1(b)

FIGS. 1(a) and 1(b) are respectively cross-sectional views showing one embodiment of a semiconductor memory cell according to the present invention. FIG. 2 is a plan view illustrating the semiconductor memory cell according to the present invention. Particularly, FIG. 1(a) is a cross-sectional view taken along line A—A of FIG. 2 and FIG. 1(b) is a cross-sectional view taken along line B—B of FIG. 2. A line A2—A2 of FIG. 1(a) and a line B2—B2 of FIG. 1(b) respectively indicate the same plane.

In the semiconductor memory cell shown in FIG. 2, each word line 2 is formed on their corresponding active region 1. Each bit line 4 is respectively electrically connected to the active region 1 which serve as diffusion layers on one side of a transistor through bit contact 3. On the other hand, each of the storage electrodes 6 is electrically connected to the active region 1 which serve as diffusion layer on the other side thereof through capacitor contact. Further, the storage electrode 6 forms a capacitive portion together with a cell plate electrode 55 (not shown in FIG. 2) with a thin insulative layer 54 (not shown in FIG. 2) interposed therebetween. Items 5 in FIG. 2 represent the central portion of the storage electrode which extends down to contact the diffusion layer 47, as illustrated in FIGS. 1(a) and 1(b).

The semiconductor memory cell according to the present embodiment is different from the conventional semiconductor memory cell in that the shape of a principal portion of each storage electrode corresponding to the capacitive portion formed on a semiconductor substrate has angles formed diagonally to the direction of a principal surface of the substrate.

With reference to FIG. 1(a) and 1(b), field oxide layer 42 is formed on a semiconductor substrate (e.g., a P type silicon substrate) 41 as a separation region. Thus, a memory cell is electrically isolated from other memory cells provided adjacent thereto. Word line 44 is provided over a gate oxide layer 43. A diffusion layer (e.g., N-type diffusion layer) 47 is provided on both sides of a transistor inclusive of each word line 44. A bit line 50 is electrically connected to its corresponding diffusion layer 47 through an opening for bit contact 49 each extending through an interlayer insulation layer 48. Storage electrodes 53, 53a and 53b are respectively electrically connected to a diffusion layer 47 through an opening for capacitor contact 52 extending through interlayer insulation layers 51, 51a and 51b. Reference numeral 45 also indicates interlayer insulative layers and reference numeral 46 indicates sidewall used for an LDD (Lightly-Doped Drain).

As shown in FIG. 1(b), the shape of the interlayer insulative layer portion 51b on each bit line 50 has an angle (e.g., 45 degrees) formed diagonally to the direction of the principal surface of the substrate. The shape of the interlayer insulative layer portion 51b is reflected throughout the shape of the storage electrode section 53b. Thus, the shape of the storage electrode section 53b also has an angle diagonal to the direction of the principal surface of the substrate.

The storage electrode 53 forms a capacitor between the storage electrode 53 and each cell plate electrode 55 with a thin insulative layer (e.g., $Si_3N_4$ having a thickness of 4 nm) interposed therebetween. Since a section 53b of the storage electrode 53 has an angle formed diagonally to the direction of the principal surface of the substrate at this time, the surface area of each storage electrode increases correspondingly. With its increase, the capacity of the capacitor formed between the storage electrode 53 and the cell plate electrode 55 also increases.

The operation of the semiconductor memory cell shown in FIGS. 1(a) and 1(b) will now be described.

When the memory cell is selected by applying a voltage to the word line 44 to drive or start up the word line 44, the memory cell reads information therefrom and writes information therein. This information is transmitted to the corresponding memory cell from the outside of the memory cell through the bit line 50. Alternatively, the information is outputted to the outside.

The retention of the information is equivalent to the retention of electric charges stored in the capacitive portion formed between the storage electrode 53 and the cell plate electrode 55. Therefore, the greater its capacity, the higher the performance of the memory cell becomes.

As described above, the structure of the semiconductor memory cell of the present invention has an advantage that since each storage electrode 53 has a section 53b set to the angle formed diagonally to the direction of the principal surface of the substrate, the capacity of the capacitive portion formed between the storage electrode 53 and the cell plate electrode 55 increases.

A method of manufacturing the semiconductor memory cell according to one embodiment of the present invention will now be described.

FIGS. 3(h) through 3(n) are respectively step views illustrating method of manufacturing the semiconductor memory cell shown in FIG. 1(a). Similarly, FIGS. 4(h) through 4(n) are respectively step views illustrating method of manufacturing the semiconductor memory cell shown in FIG. 1(b).

The following steps (1) through (7) of manufacturing the semiconductor memory cells shown in FIGS. 1(a) and 1(b) will be described with reference to these drawings.

Figure 3:
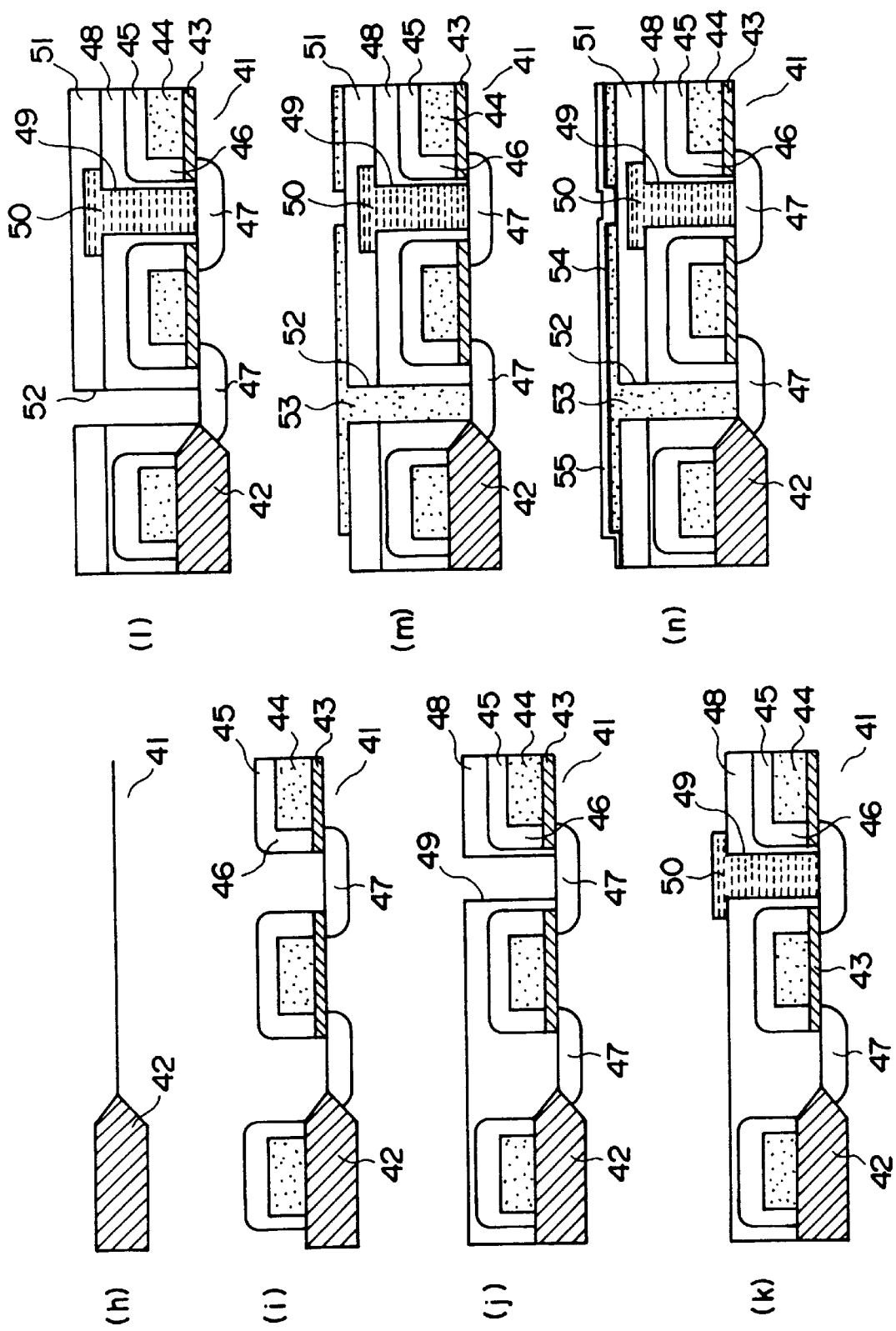
FIGS. 3(h) through 3(n) illustrates steps in the fabrication of the semiconductor memory cell shown in FIG. 1(a)
Figure 4:
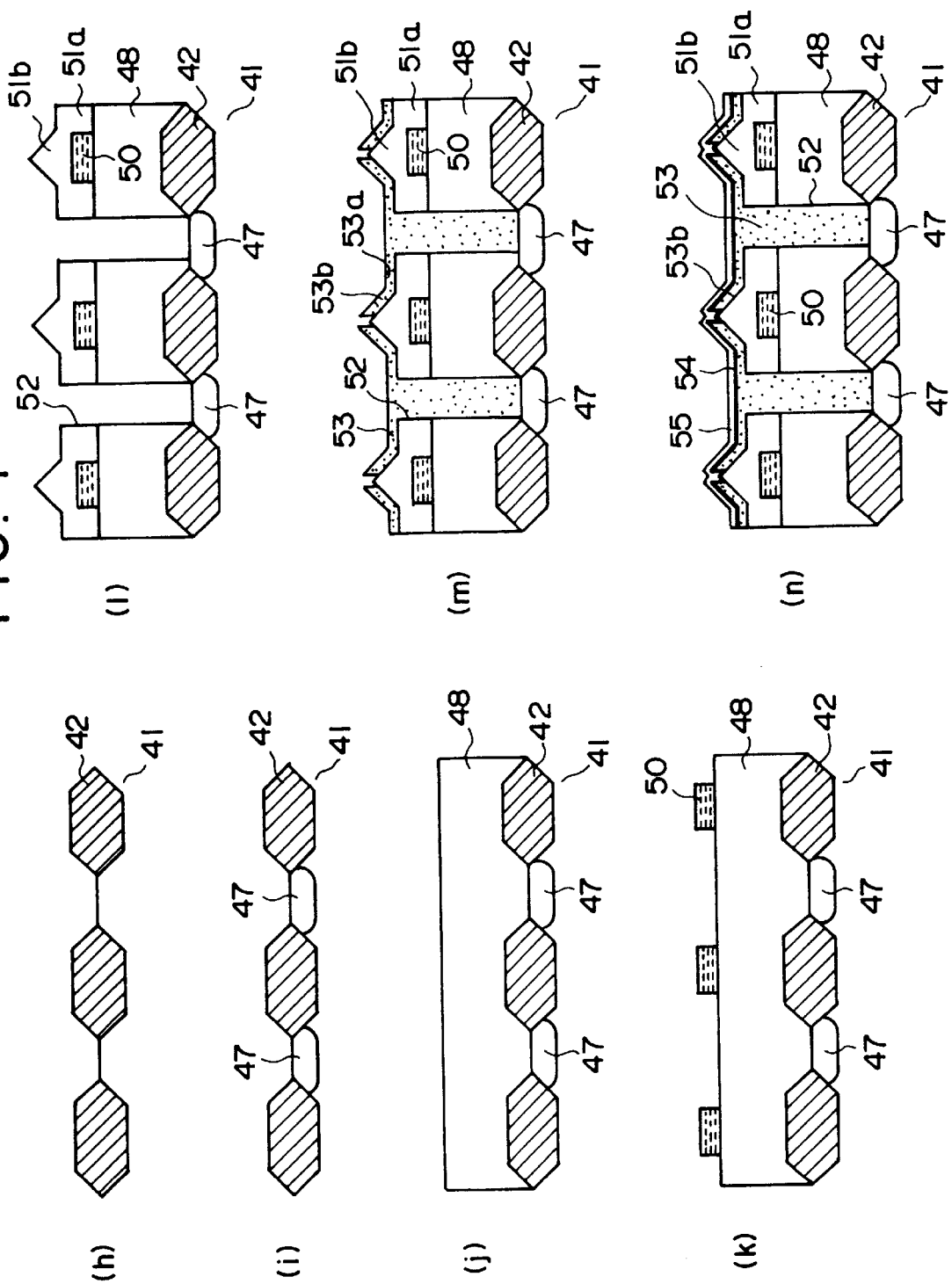
FIGS. 4(h) through 4(n) illustrates steps in the fabrication of the semiconductor memory cell shown in FIG. 1(b).

(1) Steps shown in FIGS. 3(h) and 4(h):

A field oxide layer (e.g., $SiO_2$) 42 is formed on a P-type silicon substrate 41 by using a selective oxidation process. For example, the field oxide layer 42 is subjected to heat oxidation in a wet atmosphere at 1000° C. so that the thickness of the field oxide layer 42 ranges from 100 to 800 nm.

(2) Steps shown in FIGS. 3(i) and 4(i):

Gate oxide layer 43, which has a thickness of 5 to 20 nm, is formed by a thermal oxidation process. Thereafter, polysilicon is deposited to a thickness of 100 to 300 nm by an LPCVD (Low Pressure Chemical Vapor Deposition) process, followed by being doped with an impurity such as phosphorus (P) or the like under the condition of concentrations ranging from about 1 to 6 E20cm$^{-3}$ by a thermal diffusion process, whereby the polysilicon 44 is rendered conductive.

Further, the oxide layer 45 is grown on the polysilicon 44 to a layer thickness of 100 to 300 nm by a CVD process. The oxide layer 45 and the polysilicon 44 are patterned by a photo-litho etching process to form each word line 44. Next, the resultant product is doped with phosphorus (P) or arsenic (As) under the conditions of energies ranging from 5 to 30 keV and concentrations ranging from about 1 to 5 E13cm$^{-2}$ by ion implantation.

Further, the oxide layer 45 is grown to a thickness of 50 to 300 nm by the LPCVD process and is then etched by a RIE (Reactive Ion Etching) process so that each individual sidewall 46 is formed. Thereafter, the resultant product is doped with the phosphorus (P) or arsenic (As) under the conditions of energies ranging from 10 to 100 keV and a concentration of about 1E14–16cm$^{-2}$ by ion implantation, thereby to form diffusion layer 47.

(3) Steps shown in FIGS. 3(j) and 4(j):

Oxide layer 48, which contains phosphorus (P) and boron (B), is grown to a thickness of 300 to 800 nm as a first interlayer insulative layer by an APCVD (Atmospheric Pressure Chemical Vapor Deposition) process. Further, the oxide layer 48 is allowed to reflow in an atmosphere of nitrogen at a temperature of 800 to 1000° C. Thereafter, a bit contact hole 49 whose bore diameter ranges from 0.3 to 0.4 μm, is defined by the photo-litho etching process.

(4) Steps shown in FIGS. 3(k) and 4(k):

Polysilicon is deposited to a film thickness of about 50 to 300 nm by the CVD process and is doped with an impurity such as phosphorus (P) under the condition of concentrations ranging from 1 to 6 E20cm$^{-3}$, whereby the polysilicon is rendered conductive. This processing may be done by either of the ion implantation and the thermal oxidation process. Thereafter, the polysilicon is patterned by the photo-litho etching process to form each individual bit line 50.

(5) Steps shown in FIGS. 3(l) and 4(l):

Each of oxide layers 51, 51a and 51b is grown to a thickness of 300 to 1000 nm as a second interlayer insulative layer by a bias ECR (Electron Cyclotron Resonance) CVD process corresponding to one plasma CVD process.

The bias ECR CVD process is a process of applying a bias to the substrate side upon deposition of the layer and fabricating the layer in this condition while sputtering the deposited oxide layer. As a feature of the bias ECR CVD process, may be mentioned a gutter wet for allowing the sputtered oxide layer to stay in a lower portion of a groove thereby to obtain a flat surface. Since an upper portion of a pattern is sputtered from both its sides, the oxide layer is deposited in the form of a triangle. Silane ($SiH_4$), oxygen ($O_2$), argon (Ar) and the like are used as gases in this process.

Thus, the oxide layer, which has been once deposited, is sputtered on the bit line 50 having a difference in level or steplike offset and is grown so as to fill up a recess (between the adjacent bit lines 50) of the pattern. Therefore, the oxide layer deposited on each bit line 50 on the oxide layer 48 is diagonally inclined at an angle of about 45 degrees in the direction of the principal surface of the substrate as shown in FIG. 4(l). Further, the oxide layer is thickly grown so as to be brought into the shape of each triangular oxide layer 51b.

Thereafter, a capacitor contact 52 whose bore diameter ranges from 0.3 to 0.4 μm, is caused to extend through its corresponding oxide layer 51, 51a by the photo-litho etching process.

(6) Steps shown in FIGS. 3(m) and 4(m):

The polysilicon is grown to a thickness of 50 to 300 nm by the LPCVD process. Next, the polysilicon is doped with phosphorus (P) under the condition of concentrations ranging from about 1 to 6 E20cm$^{-3}$ by ion implantation or thermal diffusion process so that the polysilicon is rendered conductive. Thereafter, the polysilicon is patterned to form storage electrodes 53, 53a and 53b by the photo-litho etching process.

At this time, as shown in FIG. 4(m), the shape of the oxide layer 51b is reflected throughout the shape of the storage electrode 53b provided above each bit line 50. Thus, the storage electrode 53b has an angle (about 45 degrees) formed diagonally to the direction of the principal surface of the substrate.

(7) Steps shown in FIGS. 3(n) and 4(n):

SiN having a layer thickness of 5 nm is grown by the LPCVD process to form an insulative layer 54 for a capacitor dielectric. Further, polysilicon is formed by the CVD process and is doped with an impurity under the condition of concentrations ranging from 1 to 6 E20cm$^{-3}$ thereby to form a cell plate electrode 55.

As has been described in detail above, the present embodiment can bring about an advantage that since the shape of each storage electrode 53 is structured so as to have a diagonal inclination, the surface area of a dielectric layer of the capacitor formed between the storage electrode and the cell plate electrode becomes greater as compared with the conventional structure, thereby making it possible to greatly increase the capacity of the memory cell.

Specific advantageous effects of the present invention will be subsequently described based on experimental data indicative of the result of comparison between the case where the present embodiment is applied to a 16 Mb DRAM and the case where the present embodiment is not applied to the 16 Mb DRAM.

Since each of the sizes of cells of the 16 Mb DRAM employed in an experiment this time is 1.4×2.8 $\mu$m$^2$, the size of the storage electrode becomes 1×2.4 $\mu$m$^2$. If an effective layer thickness (converted as a silicon oxide layer this time) of a capacitor insulative layer is represented as 4 nm, then the capacity of the memory cell is given as C1 by the following equation where the present embodiment is not applied to the 16 Mb DRAM:

$$C1 = (3.9 \times 8.85 \times E-14/40E-8) \times 2.4E-8$$
$$= 2.07E-14 \text{ [F]}$$
$$= 20.7 \text{ [fF]}$$

where 3.9 indicates a dieletric constant of the oxide layer, 8.85×E−14 indicates a dielectric constant of a vacuum, 40E−8 indicates a layer thickness [cm] and 2.4E−8 indicates a surface area [cm$^2$] of each storage electrode.

On the other hand, when the length of the base of a triangle, which forms an oblique portion of a storage electrode, is regarded as 0.3 [$\mu$m] and the angle formed between a diagonal side (hereinafter called merely "hypotenuse") of the triangle and the base thereof is regarded as 45 degrees where the present embodiment is applied to the 16 Mb DRAM, the length of the hypotenuse becomes 0.3×2$^{1/2}$[$\mu$m] and the effective surface area of each storage electrode becomes (0.4+2×0.3×2$^{1/2}$)×2.4 [$\mu$m$^2$].

The capacity of the memory cell is given as C2 by the following equation:

$$C2 = (3.9 \times 8.85 \times E-14/40E-8) \times 2.976E-8$$
$$= 2.57E-14 \text{ [F]}$$
$$= 25.7 \text{ [fF]}$$

Thus, the capacity of the memory cell can be increased by about 25% as compared with the case where the present embodiment is not applied to the 16 Mb DRAM.

The aforementioned embodiment shows the case where the P-type silicon substrate is used as the semiconductor substrate as an example. However, even if an N-type silicon substrate is used, the present embodiment can bring about the same advantage as described above. The semiconductor substrate is not necessarily limited to the silicon substrate. Other types of substrates can be sufficiently applied as an alternative to the silicon substrate.

According to the present invention, since each storage electrode is formed so as to have a surface inclined diagonally and upwardly to the direction of the principal surface of the substrate, the capacity of the memory cell can be greatly increased.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A semiconductor memory cell device, comprising:
   a semiconductor substrate having a principle surface;
   an interlayer insulation layer formed on the substrate above the principle surface, the interlayer insulation layer having spaced-apart insulation portions which are triangular in cross section, the interlayer insulation layer having an upper surface contour which includes upper side surfaces of the spaced-apart insulation portions, the upper side surfaces of each spaced-apart insulation portion extending away from the principle surface and in opposite lateral directions to an intersection therebetween;
   a storage electrode layer formed on the interlayer insulation layer so as to conform to the contour thereof, the storage electrode layer including a plurality of storage electrodes, each storage electrode including spaced-apart first and second electrode layer portions both inclined diagonally upwardly with respect to the principle surface and extending away from each other on respective upper side surfaces of adjacent ones of the spaced-apart insulation portions.

2. A semiconductor memory cell device according to claim 1, further comprising:
   word lines for selecting the storage electrodes; and
   bit lines formed directly below the spaced-apart insulation portions of triangular cross section, for transferring charge representing information to and from the storage electrodes.

3. A semiconductor memory cell device, comprising:
   a semiconductor substrate having a principle surface;
   an interlayer insulation layer disposed over the substrate above the principle surface, the interlayer insulation layer having spaced-apart insulation portions which are triangular in cross section, the interlayer insulation layer having an upper surface contour which includes upper side surfaces of the spaced-apart insulation portions, the upper side surfaces of each spaced-apart insulation portion extending away from the principle surface and in opposite lateral directions to an intersection therebetween;
   a storage electrode layer having a surface portion disposed on the interlayer insulation layer so as to conform to the upper surface contour thereof, and a stem portion, the storage electrode layer including a plurality of storage electrodes, each storage electrode including spaced-apart first and second electrode layer portions of the surface portion, both inclined diagonally upwardly with respect to the principle surface and extending away from each other on respective upper side surfaces of adjacent ones of the spaced-apart insulation portions, a central layer portion of the surface portion connecting the first and second electrode layer portions, and a solid stem of the stem portion, extending through the interlayer insulation layer and connecting the central layer portion with a first diffusion layer;

an electrode insulating layer disposed on the storage electrode layer; and a cell plate electrode disposed on the electrode insulating layer.

4. The memory cell device according to claim 3, wherein the upper side surfaces extend in a direction away from the principle surface of the semiconductor substrate at an angle that is greater than zero degrees and less than ninety degrees with respect to the principle surface of the semiconductor substrate.

5. The memory cell device according to claim 4, wherein the upper side surfaces extend in a direction away from the principle surface of the semiconductor substrate at an angle of forty-five degrees with respect to the principle surface of the semiconductor substrate.

6. The memory cell device according to claim 3, further comprising:

a substrate insulating layer disposed on the principle surface of the semiconductor substrate and having openings disposed above and extending to a second diffusion layer;

bit lines disposed on the substrate insulating layer and directly below the spaced-apart insulation portions of triangular cross section, and being electrically connected to the second diffusion layer through the openings in the substrate insulating layer.

7. The memory cell device according to claim 3, wherein the spaced-apart insulation portions of triangular cross section of the interlayer insulation layer are substantially centered symmetrically over the bit lines.

8. The memory cell device according to claim 7, wherein the upper side surfaces extend in a direction away from the principle surface of the semiconductor substrate at an angle that is greater than zero degrees and less than ninety degrees with respect to the principle surface of the semiconductor substrate.

9. The memory cell device according to claim 8, wherein the upper side surfaces extend in a direction away from the principle surface of the semiconductor substrate at an angle of forty-five degrees with respect to the principle surface of the semiconductor substrate.

10. A semiconductor memory cell device according to claim 3, further comprising:

word lines for selecting the storage electrodes; and bit lines formed directly below the spaced-apart insulation portions of triangular cross section, for transferring charge representing information to and from the storage electrodes.

* * * * *